United States Patent
Farnworth et al.

(10) Patent No.: US 6,715,018 B2
(45) Date of Patent: *Mar. 30, 2004

(54) COMPUTER INCLUDING INSTALLABLE AND REMOVABLE CARDS, OPTICAL INTERCONNECTION BETWEEN CARDS, AND METHOD OF ASSEMBLING A COMPUTER

(75) Inventors: Warren M. Farnworth, Nampa, ID (US); Alan G. Wood, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/211,924

(22) Filed: Aug. 1, 2002

(65) Prior Publication Data

US 2002/0188787 A1 Dec. 12, 2002

Related U.S. Application Data

(63) Continuation of application No. 09/098,050, filed on Jun. 16, 1998, now Pat. No. 6,453,377.

(51) Int. Cl.[7] ............................................... G06F 13/00
(52) U.S. Cl. .................. 710/300; 710/100; 710/301; 710/305; 712/1; 359/173
(58) Field of Search ........................ 710/300, 100, 710/301, 305; 359/173; 712/1

(56) References Cited

U.S. PATENT DOCUMENTS

| | | |
|---|---|---|
| 3,978,343 A | 8/1976 | Broderick et al. |
| 5,009,476 A | 4/1991 | Reid et al. |
| 5,013,247 A | 5/1991 | Watson |
| 5,119,451 A | 6/1992 | Wills et al. |
| 5,144,691 A * | 9/1992 | August et al. ............... 385/88 |
| 5,237,609 A | 8/1993 | Kimura ........................ 380/3 |
| 5,319,755 A | 6/1994 | Farmwald et al. |

(List continued on next page.)

OTHER PUBLICATIONS

"SLDRAM Architechural and Functional Overview," Peter Gillingham, SLDRAM Consortium, Aug. 29, 1997, pp. 1–14.
"Lighting the Way in Computer Design," Y.S. Liu, Circuits & Devices, Jan. 1998, pp. 23–31.
"Optics: A Maturing Technology for Better Computing," Leo Irankliotis et al., IEEE, Feb., 1998, pp. 36–51.
"Optically Interconnected Parallel Computing Systems,", Masatoshi Ishikawa et al., IEEE, Feb., 1998, pp. 61–75.
"Perspective in Optical Computing," H. John Caulfield, IEEE, Feb., 1998, pp. 22–25.
Mitkas, Perieies A., et al., "Optical processing Paradigms for Electronic Computers," *IEEE*, pp. 45–51 (Feb. 1998).
Guilfoyle, Peter S., et al., "Free–Space Interconnects for High–Performance Optoelectronic Switching", *IEEE*, pp. 69–75 (Feb. 1998).

*Primary Examiner*—Rehana Perveen
(74) *Attorney, Agent, or Firm*—Wells St. John P.S.

(57) ABSTRACT

A computer comprising a housing; a circuit board supported in the housing; a plurality of slot connectors supported on the circuit board; a first card configured for sliding receipt in one of the slot connectors; a processor mounted on the first card; a second card configured for sliding receipt in one of the slot connectors; a memory mounted on the second card; and an optical interconnect coupling the first card to the second card, the processor being configured to communicate with the memory via the optical interconnect. A method of assembling a computer, the method comprising supporting a circuit board in a housing; supporting a plurality of slot connectors on the circuit board; mounting a processor on a first card; inserting the first card into a first one of the slot connectors; mounting a memory on a second card; inserting the second card into a second one of the slot connectors; and optically coupling the first card to the second card for optical communications between the processor and the memory.

40 Claims, 6 Drawing Sheets

U.S. PATENT DOCUMENTS

| | | | |
|---|---|---|---|
| 5,347,384 A | 9/1994 | McReynolds et al. | 359/118 |
| 5,355,391 A | 10/1994 | Horowitz et al. | |
| 5,390,308 A | 2/1995 | Ware et al. | |
| 5,430,676 A | 7/1995 | Ware et al. | |
| 5,432,823 A | 7/1995 | Gasbarro et al. | |
| 5,446,696 A | 8/1995 | Ware et al. | |
| 5,475,778 A | 12/1995 | Webb | |
| 5,479,539 A * | 12/1995 | Goldsmith et al. | 385/14 |
| 5,485,490 A | 1/1996 | Leung et al. | |
| 5,499,355 A | 3/1996 | Krishnamohan et al. | |
| 5,499,385 A | 3/1996 | Farmwald et al. | |
| 5,513,021 A * | 4/1996 | Kaneshiro et al. | 359/15 |
| 5,537,573 A | 7/1996 | Ware et al. | |
| 5,546,417 A | 8/1996 | Gorelik | |
| 5,552,921 A | 9/1996 | Hetzel et al. | |
| 5,602,667 A | 2/1997 | Patel | |
| 5,621,786 A | 4/1997 | Fischer et al. | |
| 5,663,661 A | 9/1997 | Dillon et al. | |
| 5,680,361 A | 10/1997 | Ware et al. | |
| 5,841,628 A | 11/1998 | Alpert et al. | 361/600 |
| 5,886,374 A | 3/1999 | Sakamoto et al. | |
| 6,052,498 A * | 4/2000 | Paniccia | 385/14 |
| 6,249,621 B1 | 6/2001 | Sargent, IV et al. | 385/24 |
| 6,273,759 B1 * | 8/2001 | Perino et al. | 439/631 |
| 6,328,484 B1 | 12/2001 | Uebbing | |
| 6,331,382 B1 | 12/2001 | Robertson | |

* cited by examiner

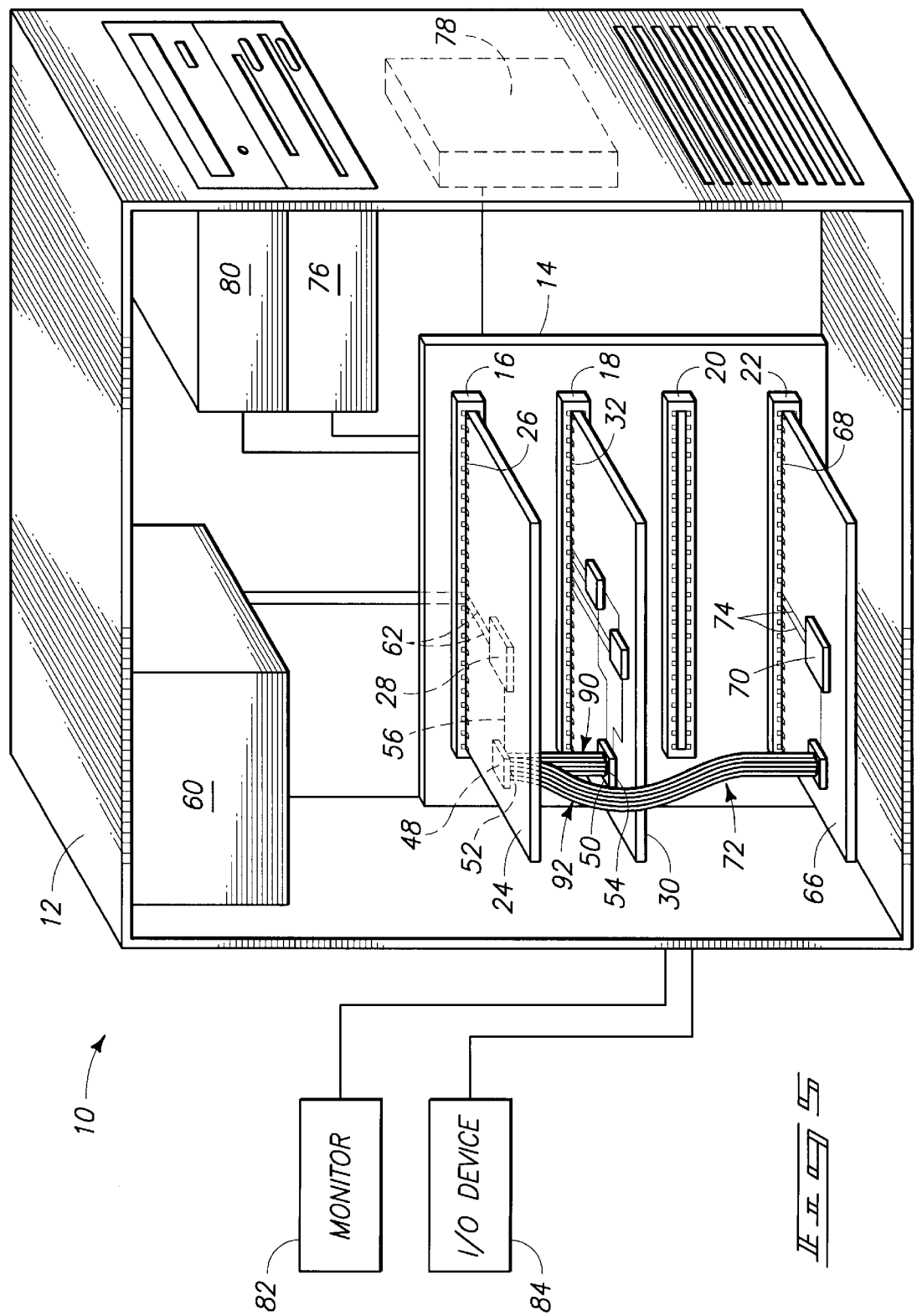

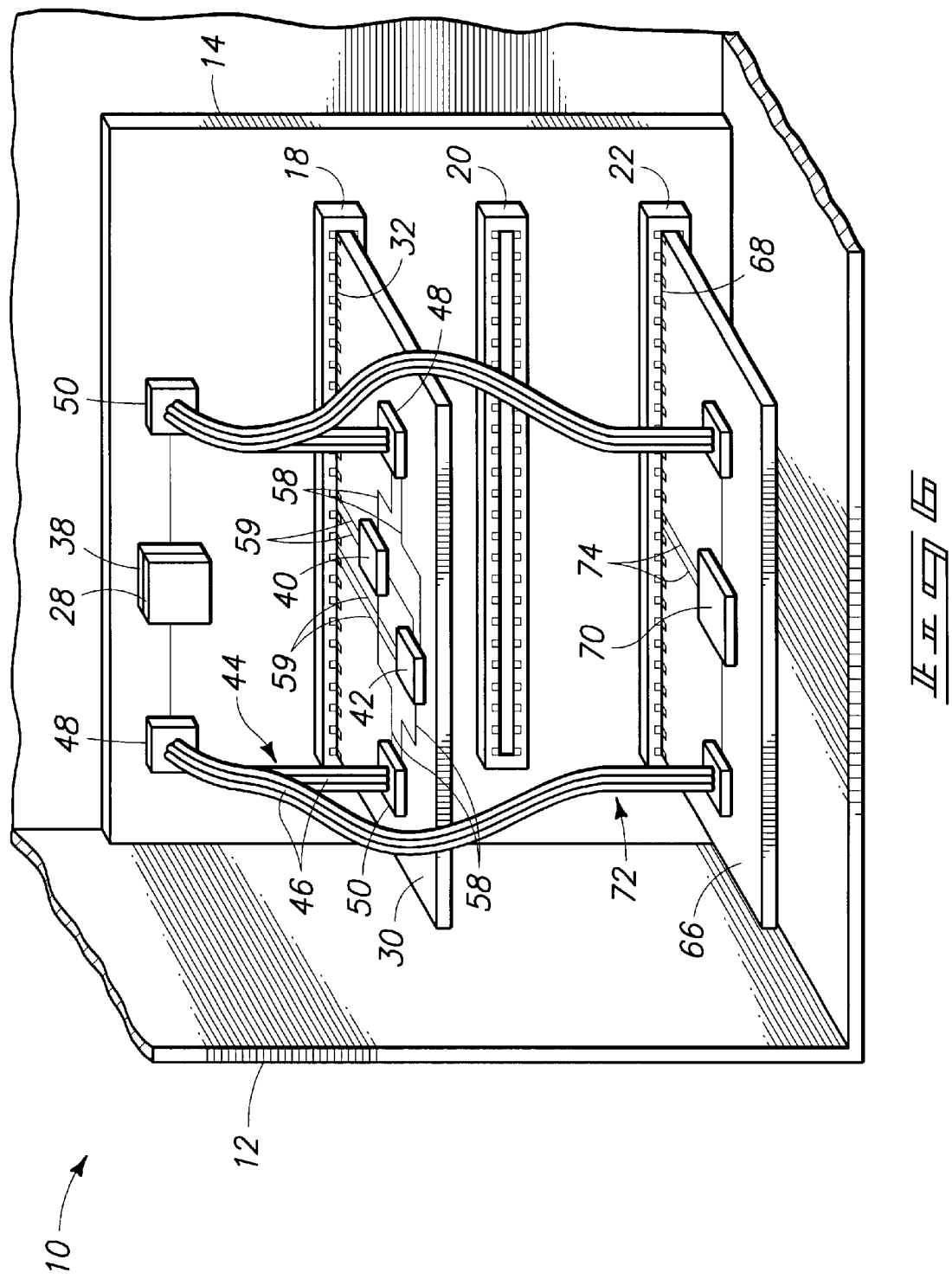

COMPUTER INCLUDING INSTALLABLE AND REMOVABLE CARDS, OPTICAL INTERCONNECTION BETWEEN CARDS, AND METHOD OF ASSEMBLING A COMPUTER

CROSS-REFERENCE TO RELATED APPLICATION

This is a continuation application of U.S. patent application Ser. No. 09/098,050, filed Jun. 16, 1998 (now U.S. Pat. No. 6,453,377), and incorporated herein by reference.

TECHNICAL FIELD

The invention relates to memory systems. The invention also relates to fiber optic systems.

BACKGROUND OF THE INVENTION

Processor speeds of computers continue to increase. Devices with which the processor communicates often do not operate at such high speeds. For example, static random access memories (SRAMs) often operate at almost as high a speed as the processor, but dynamic random access memories (DRAMs) operate at a slower speed. Dynamic random access memories possess advantages to static random access memories. For example, static random access memories require more space than dynamic random access memories.

Rambus Inc. of Mountain View, Calif. has technology that allows DRAMs and controllers or processors to transfer data at a high frequency, such as 600 megabytes per second and above over a Rambus Channel, a narrow byte-wide data bus. Attention is directed to the following patents assigned to Rambus, Inc., which are incorporated herein by reference: U.S. Pat. No. 5,680,361 to Ware et al.; U.S. Pat. No. 5,663,661 to Dillon et al.; U.S. Pat. No. 5,537,573 to Ware et al.; U.S. Pat. No. 5,499,385 to Farmwald et al.; U.S. Pat. No. 5,499,355 to Krishnamohan et al.; U.S. Pat. No. 5,485,490 to Leung et al.; U.S. Pat. No. 5,446,696 to Ware et al.; U.S. Pat. No. 5,432,823 to Gasbarro et al.; U.S. Pat. No. 5,430,676 to Ware et al.; U.S. Pat. No. 5,390,308 to Ware et al.; U.S. Pat. No. 5,355,391 to Horowitz et al.

An alternative to Rambus has been developed by memory chip makers. The synchronous link DRAM (SLDRAM) is an alternative to double-data-rate (DDR) and Direct Rambus DRAM.

The SLDRAM is known in the art. The SLDRAM, formerly known as SynchLink, is designed for computer main memory in mobile, desktop, workstation, and server systems. It is designed to reduce a speed bottleneck in accessing memory from a processor. The SLDRAM project attempts to solve a memory system problem that will become ii more acute in newer systems. DRAM memory chips do not have enough bandwidth for getting the data on or off the memory chips. To solve this problem, manufacturers have been using many chips in a wide array to get the speed up to what their system needs. However, new DRAM chips will have increasingly higher capacities, so that there will be so much DRAM capacity in the wide array of chips needed for getting the speed, that the price of the DRAM capacity raises the price of the computer. For lower price or entry-level computers and workstations, this price may be excessive. Unnecessarily large memory would exist in base configurations. Although new software uses more memory, that memory usage is not growing as fast as DRAM density, and this mismatch may result in overly expensive computers.

SLDRAM addresses this problem by using a new architecture for communicating with the DRAMs, with two highly optimized buses. This allows increasing the DRAM bandwidth significantly. SLDRAM adds pipelined transfer protocol for increased advantage of bandwidth. Attention is directed to the SLDRAM White Paper of Aug. 29, 1997, which describes SLDRAM in greater detail.

SLDRAMs are synchronously linked to processors. To provide high speed access to the memories, as processor speed increases, lengths of circuit traces should decrease.

It is known to use optical waveguides as interconnects from integrated circuit to integrated circuit. See, for example, U.S. Pat. No. 5,119,451, which is incorporated herein by reference. Various R&D efforts have taken place in an attempt to develop optical interconnect technology for short-haul data communications applications such as for communications between boards, backplanes, and intra-boxes. See, for example, "Lighting the Way in Computer Design," IEEE Circuits & Devices, January 1998.

SUMMARY OF THE INVENTION

The invention provides a computer. The computer includes a housing, and a circuit board supported in the housing. A plurality of slot connectors are supported on the circuit board. A first card is configured for sliding receipt in one of the slot connectors. A processor is mounted on the first card. A second card is configured for sliding receipt in one of the slot connectors. A memory is mounted on the second card. An optical interconnect couples the first card to the second card. The processor is configured to communicate with the memory via the optical interconnect.

In one aspect of the invention, the optical interconnect comprises a fiber optic cable.

In another aspect of the invention, the optical interconnect comprises an optical connector on the first card configured to convert between electrical signals and optical signals, and the computer further includes circuit traces on the first card coupling the optical connector to the processor.

In another aspect of the invention, the optical interconnect comprises an optical connector on the second card configured to convert between electrical signals and optical signals, and the computer further includes circuit traces on the second card coupling the optical connector to the memory.

In another aspect of the invention, the memory comprises a DRAM. In another aspect of the invention, the memory comprises a synchronous link type DRAM.

Another aspect of the invention provides a memory unit configured to be slidably received in a slot connector on a circuit board. The memory unit comprises a card having a connector configured to mate with the slot connector. A synchronous link DRAM memory is supported by the card. Circuit traces on the card extend from the connector of the card toward the memory. The circuit traces are configured to couple the memory to a power supply via the slot connector. An optical interface is supported by the card and coupled to the memory. The optical interface is configured to convert electrical signal to optical signals, for optical data transmission to and from the memory.

Another aspect of the invention provides a method of assembling a computer. The method comprises supporting a circuit board in a housing. A plurality of slot connectors are supported on the circuit board. A processor is mounted on a first card. The first card is inserted into a first one of the slot connectors. A memory is mounted on a second card. The second card is inserted into a second one of the slot connectors. The first card is optically connected to the second card for optical communications between the processor and the memory.

By reducing the circuit trace path on a memory card, communication speed is increased. Inexpensive circuit cards can be used instead of Teflon substrate or low dielectric cards. Memory integrated circuits can be mounted on cards prior to burn-in because the circuit cards are inexpensive. This is less expensive than burning-in memory integrated circuits before they are mounted on circuit cards. Unsophisticated users can add memory and integrated circuits easily. They can insert a SIMM module or card, attach one end of the fiber optic cable to an optical interconnect on the SIMM module, and attach the other end of the fiber optic cable to the optical interface on the processor card, and the installation is complete. Electromagnetic interference caused by power supply transformers or disk drives is less of a concern because the optical communications are immune to such interference.

BRIEF DESCRIPTION OF THE DRAWINGS

Preferred embodiments of the invention are described below with reference to the following accompanying drawings.

FIG. 5 is a perspective view of a computer in accordance with an alternative embodiment of the invention.

FIG. 6 is a perspective view of a computer in accordance with another alternative embodiment of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
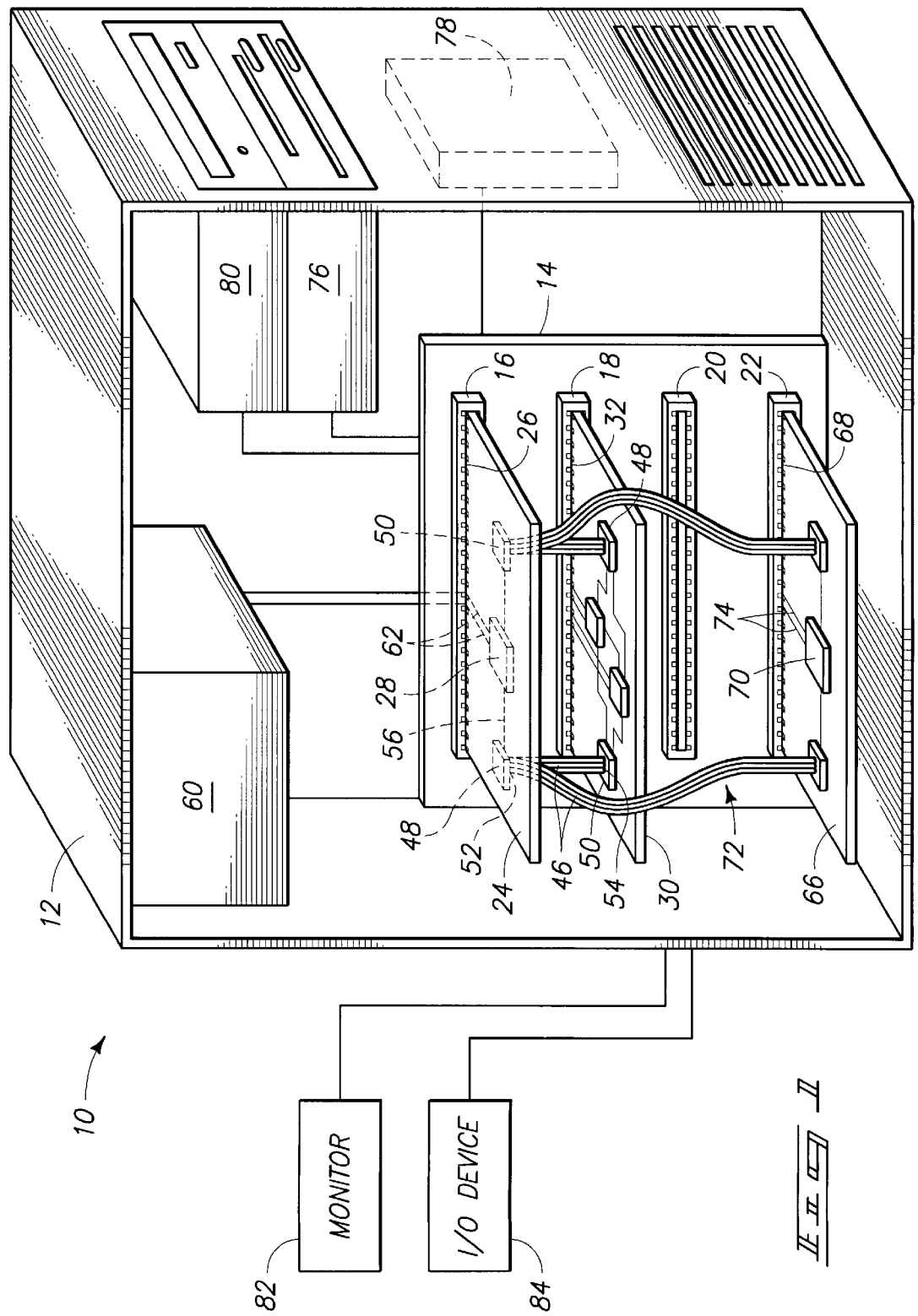
FIG. 1 is a perspective view of a computer embodying the invention.

FIG. 1 illustrates a computer 10 embodying the invention. The computer comprises a housing 12, and a circuit board 14 supported in the housing 12. The computer 10 further includes a plurality of slot connectors 16, 18, 20, 22 supported on the circuit board, and a first card 24 configured for sliding receipt in one of the slot connectors (e.g., the slot connector 16).

The first card 24 has an edge connector 26 configured for sliding receipt in the slot connector 16. The computer 10 further includes a processor 28 mounted on the first card 24.

The computer 10 further includes a second card 30 configured for sliding receipt in one of the slot connectors (e.g., the slot connector 18). The second card 30 has an edge connector 32 configured for sliding receipt in the slot connector 18.

Figure 3:
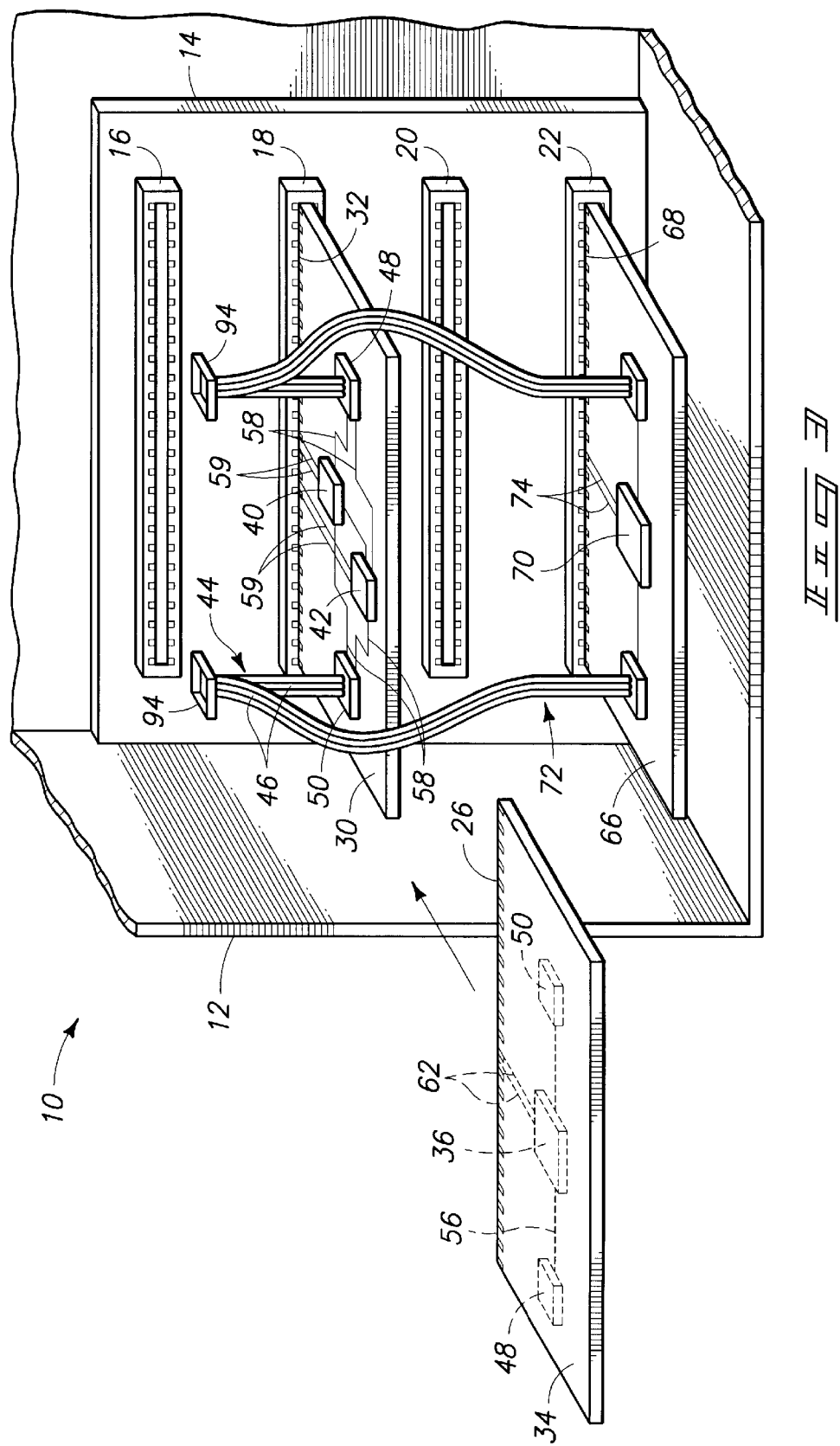
FIG. 3 is a perspective view of a computer, illustrating insertion of a card bearing a processor.
Figure 4:
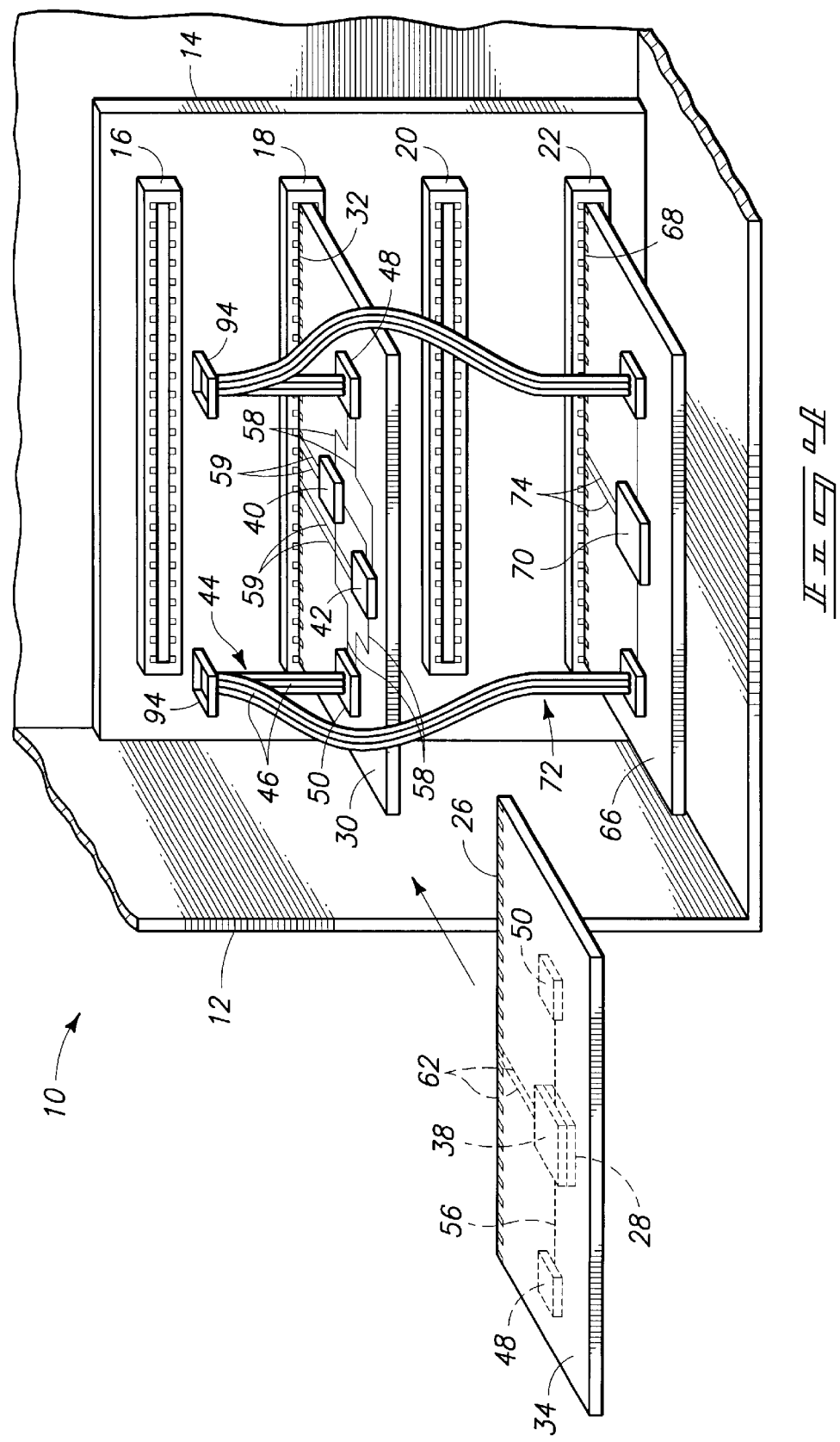
FIG. 4 is a perspective view of a computer, illustrating a card bearing a processor in accordance with an alternative embodiment of the invention.

Because the processor 28 is mounted on a removable card, it can be more easily upgraded. Instead of having to insert a processor 28 in a socket after aligning pins, the card 24 can be removed (FIG. 2) and replaced (FIG. 3) with a new card 34 bearing a new processor 36. Thus, in one embodiment (FIGS. 1–3), the processor 28 is surface mounted on the card 24. However, in an alternative embodiment (FIG. 4), the second card 30 includes a zero insertion force (ZIF) connector or socket 38 or other socket, and the processor 28 is removable received in the socket 38.

Figure 2:
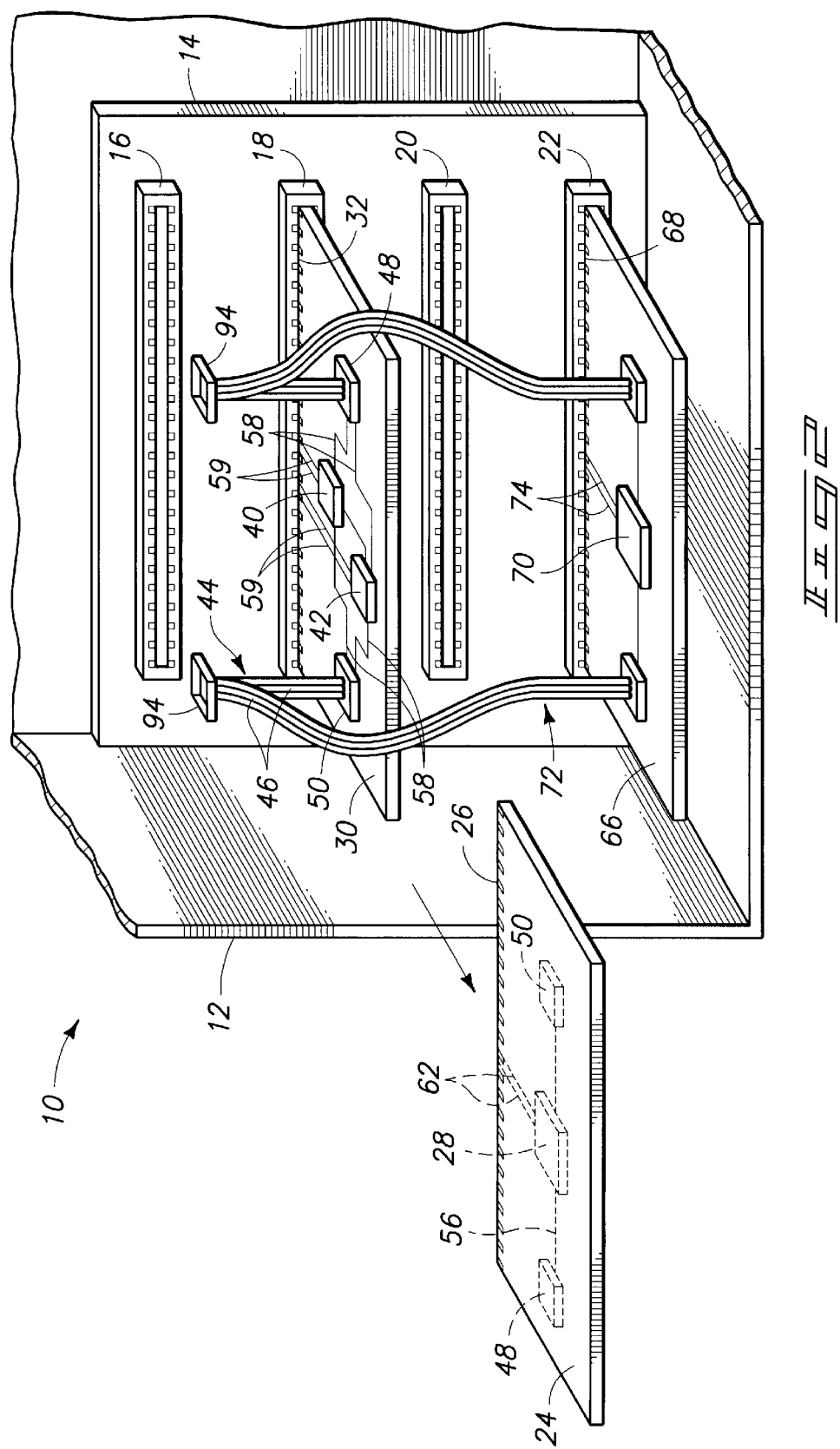
FIG. 2 is a perspective view of a computer, illustrating removal of a card bearing a processor.

The computer 10 further includes a memory 40 mounted on the second card 30 (FIG. 2). In the illustrated embodiment, the memory 40 comprises a DRAM. In a more particular embodiment, the memory 40 comprises a synchronous link type DRAM. In the illustrated embodiment, the memory 40 is defined by one or more integrated circuits. In one embodiment, the computer 10 further comprises additional integrated circuits 42 supported by the second card 30. These can be additional memory integrated circuits, for example.

The computer 10 further includes an optical interconnect 44 coupling the first card 24 to the second card 30. The processor 28 is configured to communicate with the memory 40 via the optical interconnect 44. The optical interconnect 44 thus couples the processor 28 to the memory 40 for data communications. In the illustrated embodiment, the computer 10 includes a 32 bit communications bus and the optical interconnect has capacity for a multiple of the bus width plus control signals indicating whether data is to be sent or transmission is complete.

The optical interconnect 44 comprises a fiber optic cable (or set of fiber optic cables) 46 having opposite ends 52 and 54. The optical interconnect 44 further comprises an optical connector on the first card 24 configured to convert between electrical signals and optical signals, and an optical connector on the second card 30 configured to convert between electrical signals and optical signals. Any suitable optical connectors can be employed, such as those described in the articles listed above in the Background of the Invention. For example, in one embodiment, the optical connectors and include a VCSEL optical transmitter array 48 and a VCSEL optical receiver array 50 on each card 24 and 30. The optical connectors 48 and 50 on the first and second cards 24 and 30 removably receive ends 52 and 54 of the fiber optic cable (or set of fiber optic cables) 46 directly or via a connector 94. In one embodiment, the ends of the cables from the cards 30 and 66 have separate connectors that respectively connect to the connector 50. In one embodiment, the cable 46 is a Polyguide™ waveguide available from E. I. du Pont de Nemours & Co., Inc., or a waveguide developed under the POINT program. In the illustrated embodiment, the optical connectors 48 and 50 connect or mate to an end 52 or 54 of a fiber optic cable 46 by hand, without need for a tool.

In one embodiment, shown in FIG. 5, only a single fiber optic cable or set 90 of fiber optic cables extends from the card 30. The single set is used for both transmission and reception of data. The set has a number of cables for reception that is equal to or a multiple of the bus width of the computer. The set also has a number of cables for transmission that is equal to or a multiple of the bus width of the computer. The set also has cables for control signals used to indicate data is about to be sent or that data transmission is complete. In the illustrated embodiment, the bus width is 32 bits.

Similarly, in the embodiment of FIG. 5, only a single fiber optic cable or set 92 extends from the card 66.

The computer 10 further includes circuit traces 56 on the first 11 card 24 coupling the optical connector 48 to the processor 28 (FIG. 2). The computer 10 further includes circuit traces 58 on the second card 30 coupling the optical connector 50 to the memory 40 (and memories 42). The computer 10 further including multiple respective circuit traces 59 coupling the integrated circuits 40 and 42 supported by the second card 30 to the edge connector 32 of the second card 30. Because the edge connector 32 is not used for data communication, additional traces at the edge connector can be used for power. More particularly, respective integrated circuits 40, 42 can have their own traces extending directly to the edge connector 32 instead of being coupled together on the second card 30.

The computer 10 further includes a power supply 60 in the housing 12 (FIG. 1), and conductors coupling the power supply 60 to the processor 28 via the slot connector. The conductors include circuit traces 62 on the first card 24 extending from the edge connector 26 of the first card to the processor 28. Additional circuit traces (not shown) can be used to supply power to the optical connectors. The computer 10 further includes conductors coupling the power supply 60 to the memory 40 via the slot connector 18. The conductors include the circuit traces 59 extending from the edge connector 32 of the second card 30 to the memory 40.

The slot connectors 16, 181, 20, and 22 and edge connectors 26 and 32 are used for supplying power to the processor 28 and memory 40 and perhaps for control functions, but not for data communication between the processor 28 and the memory 40

In one embodiment, the computer 10 further includes a third card 66 having an edge connector 68 configured for sliding receipt in the slot connector 22. The computer 10 further includes a co-processor 70 supported by the third card 66, and an optical interconnect 72 coupling the co-processor 70 to the processor 28. The computer 10 further includes conductors coupling the power supply to the co-processor via the slot connector 20. The conductors include circuit traces 74 on the third card 66 extending from the edge connector 68 of the third card 66 to the co-processor 70. In the illustrated embodiment, the co-processor 70 is a math co-processor. In one embodiment, the third card 66 support a Motherboard Control and Interface chipset such as a Trident (TM) chipset.

The computer 10 further includes an electronic device in the housing capable of generating electromagnetic interference. For example, the power supply 60 includes a transformer capable of generating electromagnetic interference. The computer 10 further includes a floppy disk drive 76, a hard drive 78, and a CD-ROM drive 80 coupled to the board 14. The optical interconnect 44 shields communications between the processor 28 and the memory 40 from the electromagnetic interference. The computer 10 can further include any component typically found in computers.

A monitor 82 and input/output devices (printer, keyboard, mouse) 84 can be removably coupled to the computer 10 in a conventional fashion (e.g., via parallel and serial ports included in the computer).

Another alternative embodiment is shown in FIG. 6. The embodiment of FIG. 6 is similar to the embodiment of FIG. 4, like reference numerals indicating like components, except that the processor 28 is mounted to the main circuit board (motherboard) 14 instead of being mounted on a removable card. In the illustrated embodiment, the processor is mounted on the motherboard 14 via a ZIF socket 38. In an alternative embodiment, the processor 28 is hard wired onto the motherboard 14. In these embodiments, co-processors and similar chipset may also be mounted on the motherboard 14 instead of being mounted on a removable card.

A computer such as the computer 10 can be assembled as follows. The circuit board 14 is supported in the housing 12.

The plurality of slot connectors 16, 18, 20, and 22 are supported on the circuit board (either before or after the circuit board 14 is supported in the housing 12). The processor 28 is mounted on the first card 24. The first card 24 is mounted into the slot connector 16. The memory 40 is mounted on the second card 30. The second card 30 is inserted into the slot connector 18. The first card 24 is optically coupled to the second card 30 for optical communications between the processor 28 and the memory 40.

By reducing the circuit trace path on a memory card, communication speed is increased. Inexpensive circuit cards can be used instead of Teflon substrate or low dielectric cards. Memory integrated circuits can be mounted on cards prior to burn-in because the circuit cards are inexpensive. This is less expensive than burning-in memory integrated circuits before they are mounted on circuit cards. Unsophisticated users can add memory and integrated circuits easily. They can insert a memory module or card, attach one end of the fiber optic cable to an optical interconnect on the memory card, and attach the other end of the fiber optic cable to the optical interface on the processor card, and the installation is complete. Electromagnetic interference caused by power supply transformers or disk drives is less of a concern because the optical communications are immune to such interference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A computer comprising:
   a housing;
   a circuit board supported in the housing;
   a plurality of slot connectors supported on the circuit board;
   a first card configured for sliding receipt in one of the slot connectors;
   a first circuit component mounted on the first card;
   a second card configured for sliding receipt in one of the slot connectors;
   a second circuit component mounted on the second card; and
   a flexible optical interconnect coupling the first card to the second card, the first circuit component being configured to communicate with the second circuit component via the optical interconnect, whereby the optical interconnect does not pass through the slot connectors so that interference that could otherwise be caused by signals to and from the first circuit component is impeded.

2. A computer in accordance with claim 1 wherein the optical interconnect comprises a fiber optic cable.

3. A computer in accordance with claim 1 wherein the optical interconnect comprises an optical connector on the first card configured to convert between electrical signals and optical signals, and wherein the computer further includes circuit traces on the first card coupling the optical connector to the first circuit component.

4. A computer in accordance with claim 1 wherein the optical interconnect comprises an optical connector on the second card configured to convert between electrical signals and optical signals, and wherein the computer further includes circuit traces on the second card coupling the optical connector to the second circuit component.

5. A computer in accordance with claim 1 wherein the optical interconnect comprises a first optical connector, on the first card, configured to convert between electrical signals and optical signals, wherein the computer further includes circuit traces on the first card coupling the first optical connector to the first circuit component, wherein the optical interconnect further comprises an optical connector, on the second card, configured to convert between electrical signals and optical signals, the computer further including circuit traces on the second card coupling the second optical connector to the second circuit component.

6. A computer in accordance with claim 1 wherein the second circuit component comprises a DRAM.

7. A computer in accordance with claim 1 wherein the second circuit component comprises a synchronous link type DRAM.

8. A computer comprising:
    a housing;
    a motherboard supported in the housing;
    a slot connector supported on the motherboard;
    a first circuit component supported by the motherboard;
    a card configured for sliding receipt in one of the slot connectors;
    a second circuit component mounted on the card; and
    a flexible optical interconnect coupling the card to the motherboard, the first circuit component being configured to communicate with the second circuit component via the optical interconnect, whereby the flexible optical interconnect does not pass through the slot connectors so that interference that could otherwise be caused by signals to and from the first circuit component is impeded.

9. A computer in accordance with claim 8 wherein the first circuit component is hard wired to the motherboard.

10. A computer in accordance with claim 8 and further comprising a ZIF connector mounted to the motherboard, and wherein the first circuit component is removably received in the ZIF connector.

11. A computer in accordance with claim 8 wherein the optical interconnect comprises an optical connector on the card configured to convert between electrical signals and optical signals, and an optical connector on the motherboard configured to convert between electrical signals and optical signals.

12. A computer in accordance with claim 8 wherein the first circuit component comprises a DRAM.

13. A computer in accordance with claim 8 wherein the first circuit component comprises a synchronous link type DRAM.

14. A computer comprising:
    a housing;
    a circuit board supported in the housing;
    a plurality of slot connectors supported on the circuit board;
    a first card having an edge connector configured for sliding receipt in a first one of the slot connectors;
    a processor supported by the first card;
    a second card having an edge connector configured for sliding receipt in a second one of the slot connectors;
    a synchronous link DRAM memory supported by the second card;
    a power supply in the housing;
    conductors coupling the power supply to the processor via the first slot connector, the conductors including circuit traces on the first card extending from the edge connector of the first card toward the processor;
    conductors coupling the power supply to the memory via the second slot connector, the conductors including circuit traces on the second card extending from the edge connector of the second card toward the memory; and
    an optical interconnect coupling the processor to the memory for data communications, the optical interconnect being within the housing, wherein the optical interconnect does not pass through the slot connectors.

15. A computer in accordance with claim 14 and further comprising a third card having an edge connector configured for sliding receipt in a third one of the slot connectors, a co-processor supported by the third card, and an optical interconnect coupling the co-processor to the processor.

16. A computer in accordance with claim 15 and further comprising conductors coupling the power supply to the co-processor via the third slot connector, the conductors including circuit traces on the third card extending from the edge connector of the third card toward the co-processor.

17. A computer in accordance with claim 15 wherein the co-processor is a math co-processor.

18. A computer in accordance with claim 15 and further including an electronic device in the housing capable of generating electromagnetic interference, and wherein the optical interconnect shields communications between the processor and the memory from the electromagnetic interference.

19. A computer comprising:
    a housing;
    a circuit board supported in the housing;
    a plurality of slot connectors supported on the circuit board;
    a first card having an edge connector configured for sliding receipt in a first one of the slot connectors;
    a first integrated circuit supported by the first card;
    a second card having an edge connector configured for sliding receipt in a second one of the slot connectors;
    a second integrated circuit supported by the second card;
    a power supply in the housing;
    conductors coupling the power supply to the first integrated circuit via the first slot connector, the conductors including circuit traces on the first card extending from the edge connector of the first card toward the first integrated circuit;
    conductors coupling the power supply to the second integrated circuit via the second slot connector, the conductors including circuit traces on the second card extending from the edge connector of the second card toward the second integrated circuit; and
    an optical interconnect coupling the first integrated circuit to the second integrated circuit for data communications, the optical interconnect being within the housing, wherein the optical interconnect does not pass through the slot connectors.

20. A computer in accordance with claim 19, and further comprising a third card having an edge connector configured for sliding receipt in a third one of the slot connectors, a co-processor supported by the third card, and an optical interconnect coupling the co-processor to the processor wherein the first integrated circuit comprises a processor, and wherein the second integrated circuit comprises a memory.

21. A computer in accordance with claim 20 and further comprising conductors coupling the power supply to the co-processor via the third slot connector, the conductors including circuit traces on the third card extending from the edge connector of the third card toward the co-processor.

22. A computer in accordance with claim 20 wherein the co-processor is a math co-processor.

23. A computer in accordance with claim 20 and further including an electronic device in the housing capable of generating electromagnetic interference, and wherein the optical interconnect shields communications between the processor and the memory from the electromagnetic interference.

24. A method of assembling a computer, the method comprising:
supporting a circuit board in a housing;
supporting a plurality of slot connectors on the circuit board;
mounting a first circuit component on a first card;
inserting the first card into a first one of the slot connectors;
mounting a second circuit component on a second card;
inserting the second card into a second one of the slot connectors; and
flexibly optically coupling the first card to the second card for optical communications between the first circuit component and the second circuit component, whereby the flexible optical interconnect does not pass through the slot connectors so that interference that could otherwise be caused by signals to and from the first circuit component is impeded.

25. A method of assembling a computer in accordance with claim 24 wherein optically coupling the first card to the second card comprises using a fiber optic cable.

26. A method of assembling a computer in accordance with claim 24 wherein optically coupling the first card to the second card comprises supporting an optical connector on the first card to convert between electrical signals and optical signals, and forming circuit traces on the first card to couple the optical connector to the first circuit component.

27. A method of assembling a computer in accordance with claim 24 wherein optically coupling the first card to the second card comprises supporting an optical connector on the second card to convert between electrical signals and optical signals, and forming circuit traces on the second card to couple the optical connector to the second circuit component.

28. A method of assembling a computer in accordance with claim 24 wherein optically coupling the first card to the second card comprises supporting an optical connector on the first card to convert between electrical signals and optical signals, forming circuit traces on the first card to couple the optical connector to the first circuit component, supporting an optical connector on the second card to convert between electrical signals and optical signals, and forming circuit traces on the second card to couple the optical connector to the second circuit component.

29. A method of assembling a computer in accordance with claim 24 wherein mounting the second circuit component comprises mounting a DRAM on the first card.

30. A method of assembling a computer in accordance with claim 24 wherein mounting the second circuit component comprises mounting a synchronous link type DRAM on the first card.

31. A method of assembling a computer, the method comprising:
supporting a circuit board in a housing;
supporting a plurality of slot connectors on the circuit board;
supporting a processor on a first card having an edge connector;
inserting the edge connector of the first card into a first one of the slot connectors to support the first card from the circuit board;
providing a second card having an edge connector configured for sliding receipt in a second one of the slot connectors;
supporting a synchronous link DRAM memory on a second card having an edge connector;
inserting the edge connector of the second card into a second one of the slot connectors to support the second card from the circuit board;
supporting a power supply in the housing;
coupling the power supply to the processor via the first slot connector, the coupling including using circuit traces on the first card extending from the edge connector of the first card toward the processor;
coupling the power supply to the memory via the second slot connector, the coupling including using circuit traces on the second card extending from the edge connector of the second card toward the memory; and
optically coupling the processor to the memory for data communications using an optical interconnect within the housing, wherein the flexible optical interconnect does not pass through the slot connectors.

32. A method of assembling a computer in accordance with claim 31 and further comprising supporting a co-processor on a third card having an edge connector, and optically coupling the co-processor to the processor.

33. A method of assembling a computer in accordance with claim 32 and further comprising coupling the power supply to the co-processor via the third slot connector, the coupling comprising using circuit traces on the third card extending from the edge connector of the third card toward the co-processor.

34. A method of assembling a computer in accordance with claim 32 wherein supporting a co-processor comprises supporting a math co-processor on the third card.

35. A method of assembling a computer, the method comprising:
supporting a circuit board in a housing;
supporting a plurality of slot connectors on the circuit board;
supporting a first integrated circuit on a first card having an edge connector;
inserting the edge connector of the first card into a first one of the slot connectors to support the first card from the circuit board;
providing a second card having an edge connector configured for sliding receipt in a second one of the slot connectors;
supporting a second integrated circuit on a second card having an edge connector;
inserting the edge connector of the second card into a second one of the slot connectors to support the second card from the circuit board;
supporting a power supply in the housing;
coupling the power supply to the first integrated circuit via the first slot connector, the coupling including using circuit traces on the first card extending from the edge connector of the first card toward the first integrated circuit;

coupling the power supply to the second integrated circuit via the second slot connector, the coupling including using circuit traces on the second card extending from the edge connector of the second card toward the second integrated circuit; and optically coupling the first integrated circuit to the second integrated circuit for data communications using an optical interconnect within the housing, wherein the flexible optical interconnect does not pass through the slot connectors.

36. A method of assembling a computer in accordance with claim 35 and further comprising supporting a co-processor on a third card having an edge connector, and optically coupling the co-processor to the processor, wherein the first integrated circuit comprises a processor, and wherein the second integrated circuit comprises a memory.

37. A method of assembling a computer in accordance with claim 35 and further comprising coupling the power supply to the co-processor via the third slot connector, the coupling comprising using circuit traces on the third card extending from the edge connector of the third card toward the co-processor.

38. A method of assembling a computer in accordance with claim 35 wherein supporting a co-processor comprises supporting a math co-processor on the third card.

39. A system comprising:

a housing;

a circuit board supported in the housing;

a plurality of slot connectors supported on the circuit board;

a first card configured for sliding receipt in one of the slot connectors;

a first circuit component mounted on the first card a second card configured for sliding receipt in one of the slot connectors;

a second circuit component mounted on the second card; and a flexible optical interconnect coupling the first card to the second card, the first circuit component being configured to communicate with the second circuit component via the optical interconnect, whereby the optical interconnect does not pass through the slot connectors so that interference that could otherwise be caused by signals to and from the first circuit component is impeded.

40. A system in accordance with claim 39 wherein the optical interconnect comprises a fiber optic cable.

* * * * *

UNITED STATES PATENT AND TRADEMARK OFFICE
CERTIFICATE OF CORRECTION

PATENT NO.    : 6,715,018 B2
DATED         : March 30, 2004
INVENTOR(S)   : Farnworth et al.

It is certified that error appears in the above-identified patent and that said Letters Patent is hereby corrected as shown below:

Title page,
Item [56], References Cited, U.S. PATENT DOCUMENTS, please insert
-- 6,157,966  12/2000  Montgomery et al. -- and -- 6,202,110  3/2001  Coteus et al. --
after the "6,052,498" reference.

Column 1,
Line 54, please delete "ii" after "become".

Column 4,
Line 36, please delete "and" after "connectors" and insert -- can --.
Line 64, please delete "11" after "first".

Column 5,
Line 22, please delete "181" after "16" and insert -- 18 --.

Column 11,
Lines 18 and 24, please delete "35" after "claim" and insert -- 36 --.

Signed and Sealed this

Fourteenth Day of September, 2004

JON W. DUDAS
*Director of the United States Patent and Trademark Office*